United States Patent [19]

Herzog et al.

[11] Patent Number: 4,588,959

[45] Date of Patent: May 13, 1986

[54] HUM NEUTRALIZATION CIRCUIT

[75] Inventors: William E. Herzog; John H. Atkins, both of Rochester, N.Y.

[73] Assignee: Harris Corporation, Melbourne, Fla.

[21] Appl. No.: 630,185

[22] Filed: Jul. 12, 1984

[51] Int. Cl.[4] .............................................. H03F 1/30
[52] U.S. Cl. ...................................... 330/149; 330/76; 330/96
[58] Field of Search ................. 330/3, 76, 85, 96, 149, 330/291, 292

[56] References Cited

U.S. PATENT DOCUMENTS 2,786,901 3/1957 Nelson .................................... 330/76
3,042,877 7/1962 Barnes .................................... 330/149

Primary Examiner—Eugene R. LaRoche
Assistant Examiner—Steven J. Mottola
Attorney, Agent, or Firm—L. Lawton Rogers, III; Joseph M. Killeen

[57] ABSTRACT

A method and hum neutralization circuit for a grounded grid triode radio frequency amplifier in which the hum signal is detected and a portion thereof related to the amplification of the amplifier applied to the cathode to oppose, when amplified, in amplitude and phase, the effects of the hum signal on the output signal of the amplifier.

8 Claims, 4 Drawing Figures

HUM NEUTRALIZATION CIRCUIT

BACKGROUND OF THE INVENTION

The present invention relates to a method and apparatus for neutralization of unwanted signals from a direct current, or more particularly, to a method for cancelling hum emanating from a DC power supply to a triode amplifier.

Amplifiers used for the amplification of radio frequency ("RF") signals commonly derive their power from a direct current ("DC") power supply. Frequently, such DC power supplies are energized by an alternating current ("AC") signal which is repeatedly switched at a hiqh frequency to provide both rectification and regulation of the power signal. Frequently, the power signal is not at a constant DC voltage but has both random and periodic variations in amplitude. The periodic variations, sometimes called "hum", often have the same frequency as the alternating current energizing the power supply.

If variations are present in the DC power signal supplying an RF amplifier, such variations are sensed by the amplifier and passed through, with or without amplification to the output signal from the amplifier. Hence, great care must be taken in eliminating such power supply variations.

It is known to remove hum from a DC power supply voltage by the use of a capacitor shunt across the power voltage, shunting unwanted AC signals to ground while permitting the desired DC signal to pass. However, such capacitors usually do not eliminate all the hum signal from the power supply voltage. Moreover, the use of a large and stable capacitor which could be utilized in a circuit for a power supply in a high voltage RF amplifier is expensive, both in terms of the cost of the capacitor and the utilization of space within an amplifier enclosure.

Various circuit arrangements for elimination of substantial variations and hum in a supply voltage have been proposed. For example, numerous rectifier circuits and filter circuits have been designed to reduce variations in the power supply voltage before the voltage is applied to an amplifier. Additionally, it is known to compensate for variations in supply voltage by introducing a portion of the supply voltage to the grid electrode of a conventional tube-type amplifier.

For example, the Shepard, Jr. U.S. Pat. No. 2,313,097 dated Mar. 9, 1943 discloses the cancellation of the unwanted hum signal by introducing on the screen grid a proportion of the supply voltage variation sufficient to provide an equal amplitude and opoosite polarity variation to the variation normally present in the output circuit of the amplifier. Such prior art systems for reducing hum, often require that the frequency of the variation in the power supply be known prior to design of the compensating circuit. This requirement stems from the fact that the compensating circuit often contains components which must be tuned to the hum frequency in order to isolate the hum signal. The usefulness of these types of compensating circuit is reduced if the power supply variation is of a random or unknown frequency.

Similarly, the Barnes U.S. Pat. No 3,042,877 dated July 3, 1962 discloses a hum compensator in which a supply voltage hum signal derived by a transformer is applied to the cathode of a conventional audio signal triode amplifier. Such prior art hum compensation systems commonly depend upon the positive transconductance of the electron tube being used as an amplifier. While this assumption is valid for most audio frequency amplifiers, similar amplifiers used for RF signals frequently exhibit an opposite reaction to the application of an RF signal. Therefore, many of the hum compensation techniques used for audio frequency amplifiers are not appropriate for RF signal amplifiers. Indeed, the use of audio amplifier compensation techniques may only serve to exacerbate the RF signal variations because the compensating signals would be applied to the amplifier in the opposite phase as is needed to compensate, resulting in reinforcement, not a cancellation, of the variation signal.

It is accordingly an object of the present invention to obviate these and other known problems in RF signal amplifier circuits and to provide a novel method and apparatus for reducing power supply induced variations in the output signal of an RF amplifier.

It is another object of the present invention to provide a novel method and apparatus for reducing power supply variations without the use of large and expensive capacitor filters.

It is yet another object of the present invention to provide a novel method and apparatus for eliminating hum in RF signal amplifiers.

These and many other objects and advantages of the present invention will be apparent to one skilled in the art from the claims and from the following detailed description when read in conjunction with the appended drawings.

THE DRAWINGS

DETAILED DESCRIPTION OF THE PREFERRED EMBODIMENTS

Figure 1:
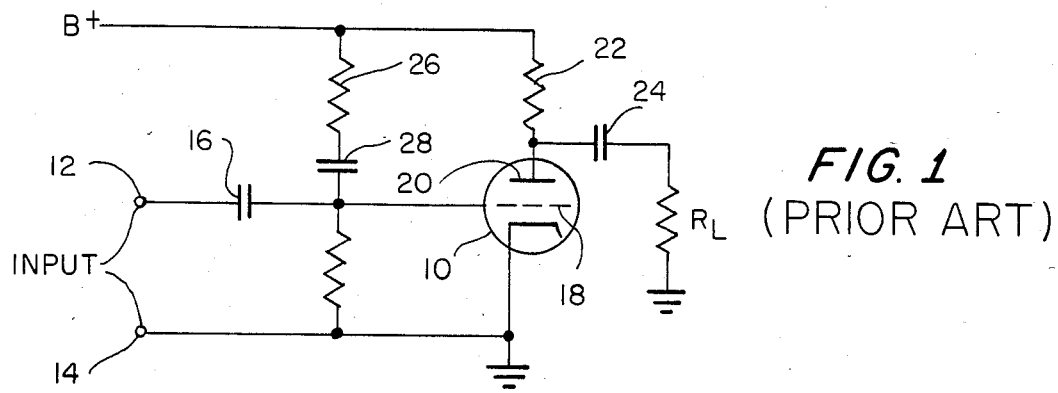
FIG. 1 is a schematic circuit diagram of a prior art hum neutralization circuit.

FIG. 1 depicts a known hum neutralization circuit used in conjunction with a triode amplifier 10. An input signal to be amplified may be placed across a set of input terminals 12, 14. The input signal is filtered by a DC blocking capacitor 16 and subsequently applied to the grid electrode 18 of the triode amplifier 10. The triode amplifier 10 is powered by a supply voltage which is applied to the anode electrode 20 of the triode amplifier 10 after passing through a plate resistor 22. The output of the triode amplifier 10 is taken across the anode to ground after being filtered by a capacitor 24. Hum compensation is supplied by a circuit comprising a resistor 26 and a DC blocking capacitor 28 serially connected between the supply voltage and the grid electrode 18 of the triode amplifier 10.

In operation, variations in the supply voltage will be superimposed on the output voltage appearing at the load RL. To compensate for the superimposed variations, a portion of the variation signal is tapped by the resistor 26 and the capacitor 28 and is supplied to the grid electrode of the triode amplifier 10. The resistor 26 is selected to attenuate the tapped variation signal to a sufficient degree such that upon amplification by the triode amplifier 10 the tapped variation signal is equal in amplitude to the variation signal appearing directly at the anode electrode 20 of the triode amplifier 10. With an audio frequency triode amplifier such as that used in the circuit shown in FIG. 1, variations in the voltage of the grid electrode 18 cause a variation in the voltage appearing at the anode electrode 20 which is opposite in phase to that appearing at the grid electrode 18. Thus, the tapped and amplified variation in the supply voltage appearing at the anode electrode 20 will be of the same amplitude and of the opoosite phase to the variation in the supply voltage appearing directly, i.e., through the plate resistor 22, at the anode electrode 20 and the hum, or variation, signal will be neutralized thereby.

Figure 2:
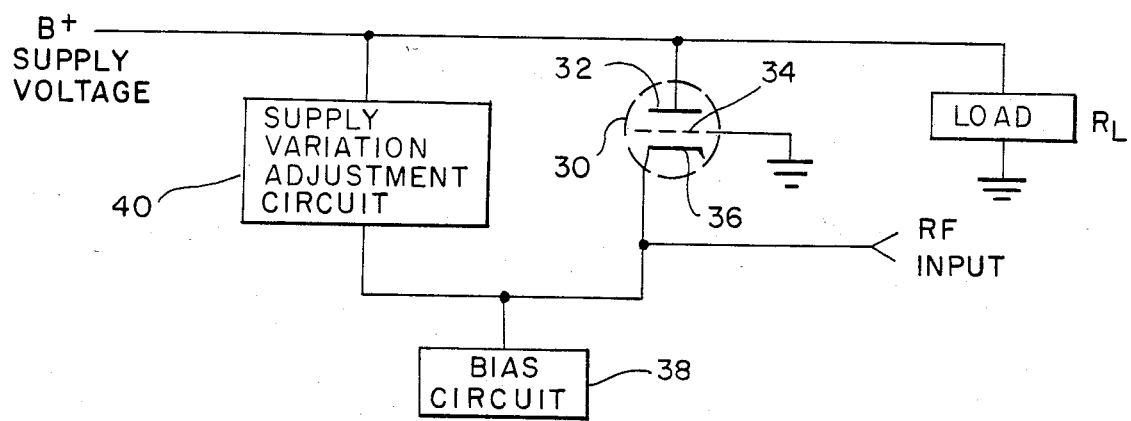
FIG. 2 is a simplified schematic diagram of the hum neutralization circuit of the present invention.

With reference to FIG. 2, a triode amplifier 30 is utilized to amplify an RF inout signal. A supply voltage is applied to the anode electrode 32 of the triode amplifier 30, the grid electrode 34 of the triode amplifier is grounded, and the RF input signal is applied to the cathode electrode 36 of the triode amplifier 30 along with a bias voltage derived from a conventional bias circuit 38. The output signal from the triode amplifier 30 appears at the anode electrode 32 for application to a load, RL. A supply voltage variation adjustment circuit 40 is electrically connected between the supply voltage B+ and the cathode electrode 36 of the triode amplifier 30.

In order to adjust for supply voltage variations, the supply voltage variation adjustment circuit 40 isolates a desired portion of the variation signal occurring in the supply voltage and applies that portion of the voltage variation to the cathode electrode 36 so that upon further amplification by the triode amplifier 30, the amplified portion of the voltage variation is equal in amplitude to the voltage variation appearing directly at the anode electrode 32.

Note that the supply variation adjustment circuit 40 of FIG. 2 provides the portion of the voltage variation to the cathode electrode 36. In audio frequency circuits, as depicted in FIG. 1, the application of the voltage variation to the cathode electrode would result in an increase in the voltage variation appearing at the output of the amplifier because the amplification of the portion of the voltage variation appearing at the cathode would result in a signal which is in phase with the variation signal appearing directly at the anode and therefore the variation would be doubled rather than cancelled. However, with a triode amplifier operating in the RF range, the portion of the voltage variation supplied to the cathode is amplified at a phase 180 degrees from the phase of the voltage variation appearing directly at the anode electrode. Neutralization is thereby achieved.

Figure 3:
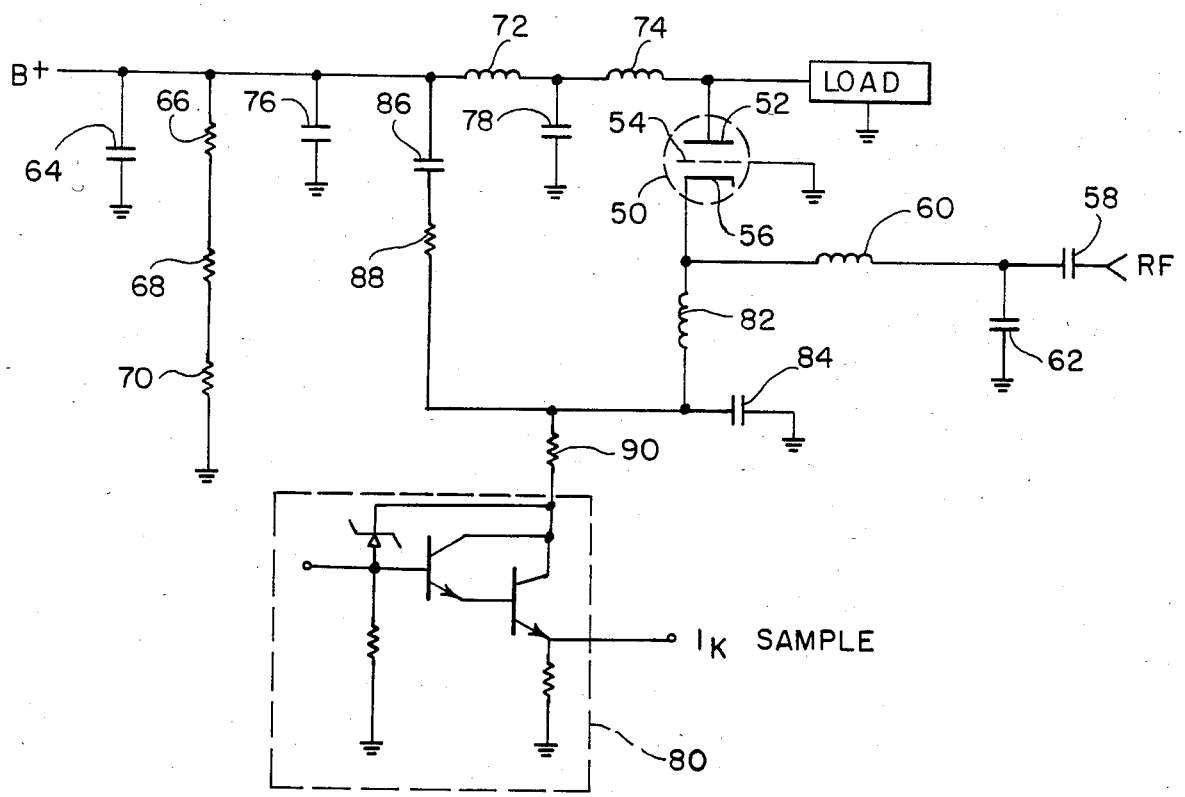
FIG. 3 is a schematic circuit diagram of one embodiment of the hum neutralization circuit of FIG. 2.

With reference to FIG. 3, a hum neutralization circuit in accordance with the present invention is utilized in combination with a triode amplifier is to amplify RF signals.

The circuit includes a triode amplifier 50 electrically connected to the supply voltage and operated in a "grounded grid" configuration, i.e. its anode 52 is connected to the supply voltage, its grid 54 is grounded, and its cathode 56 serves as the input electrode of the amplifier 50. An RF input signal is provided through a blocking capacitor 58 and an impedance matching circuit (comprising an inductor 60 and a capacitor 62) to the cathode 56 of the triode amplifier 50. The supply voltage is filtered by a high voltage capacitor 64 to reduce supply voltage variations. A conventional set of bleeder resistors 66, 68 and 70 tie the supply voltage to ground. The anode 52 of the triode amplifier 50 is decoupled from the supply voltage through a decoupling circuit comprising two inductors 72 and 74 and two capacitors 76 and 78.

A conventional amplifier bias circuit 80 is electrically connected to the cathode 56 through a decoupling inductor 82 and a capacitor 84. The bias circuit 80 controls the keyed and unkeyed bias voltage of the amplifier circuit.

With continued reference to FIG. 3, a variation compensation circuit comprising a DC blocking capacitor 86 and a voltage divider comprising a pair of resistors 88, 90 provide a portion of the supply voltage variation to the cathode 56 of the triode amplifier 50. The sizes of the resistors 88 and 90 determine the attenuation of the supply voltage variation which is applied to the cathode 56. The sizes of the resistors 88 and 90 are selected so that when the attentuated supply voltage variation applied to the cathode is amplified by the triode amplifier 50 the resultant voltage appearing at the anode 52 as a result of the attenuated supply voltage variation is equal in amplitude to the supply voltage variation signal appearinq directly at the anode 52. Since the amplifier 50 is operating in an RF regime, the application of the attenuated supply voltage variation to the cathode results in an amplified variation at the anode which is opposite in phase to the variation signal appearing directly from the supply voltage. Thus, the supply voltage variation is cancelled.

Figure 4:
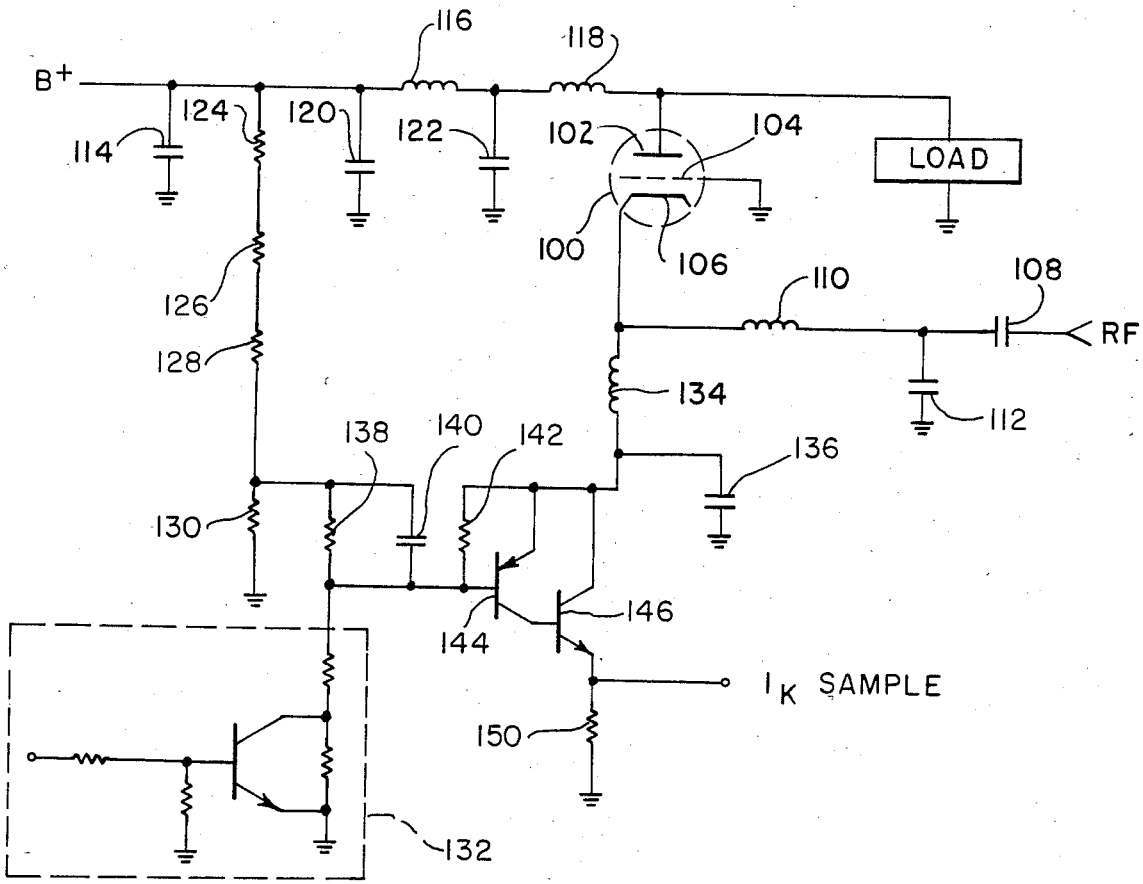
FIG. 4 is a schematic circuit diagram of a second embodiment of the hum neutralization circuit of FIG. 2.

FIG. 4 depicts a second embodiment of a hum neutralization circuit in accordance with the present invention. With reference to FIG. 4, a triode amplifier 100 is configured in "grounded grid" configuration, i.e. the supply voltage is connected to the anode 102, the grid 104 is grounded, and the cathode 106 serves as the input electrode. An RF input signal is supplied to the cathode 106 through a DC blocking capacitor 108 and through an RF impedance matching circuit comprising an inductor 110 and a capcitor 112.

The supply voltage is filtered by a high voltage capacitor 114 and is decoupled from the anode 102 by a decoupling circuit comprising two inductors 116 and 118 and two capacitors 120 and 122. A conventional series of bleeder resistors 124, 126, 128, 130 tie the supply voltage to ground.

A conventional DC cutoff/idle bias circuit 132 provides biasing to the cathode 106 through a cathode decoupling circuit comprising an inductor 134 and a capacitor 136.

With continued reference to FIG. 4, the detector circuit comprises a resistor 138 and a parallel capacitor 140, a base resistor 142, two transistors configured in emitter-follower configuration 144, 146, and a sample resistor 150 connected between the transistors 144, 146, and the ground reference.

In operation, the supply voltage is attenuated by the bleeder resistors 124, 126, 128, 130 and a selected portion of the supply voltage variation is detected within the series of bleeder resistors 124, 126, 128, 130. The detected variation signal is then applied to the emitter-follower transistors 144, 146 to control current to the cathode 106. If desired, the current may be monitored at the point shown as "$I_k$ Sample" in FIG. 4. The bleeder resistors 124, 126, 128, 130, the resistor 138 and the parallel capacitor 140 are selected so that when the supply voltage variation is first attenuated by the bleeder resistors 124, 126, 128 and by the hum neutralization circuit resistor 138 and subsequently amplified at the amplifier 100, the amplitude of the amplified attenuated supply voltage variation appearing at the anode 102 is equal to the supply voltage variation signal appearing directly at the anode 102 through the decoupling circuit. In this way, variations in the supply voltage may be reduced or eliminated altogether.

These and many other advantages of the present invention will be readily apparent to one skilled in the art from the claims. It should be understood that the foregoing description of the preferred embodiments is illustrative only, that many modifications may be made without departing from the spirit thereof as defined in the claims when accorded a full range of equivalents.

What is claimed is:

1. An RF amplifier circuit in which variations in the output signal of the RF amplifier caused by variations in a DC supply voltage energizing said amplifier are substantially neutralized, comprising:
   a triode RF amplifier having it anode electrode energized by said DC supply voltage, it grid electrode grounded and its cathode electrode electrically connected to a source for an RF signal to be amplified;
   a DC blocking capacitor electrically connected to said DC supply voltage to provide a variation voltage signal substantially similar to the variations in said DC supply voltage;
   a plurality of serially-connected resistors connected as a voltage divider between said DC blocking capacitor and the cathode electrode to attenuate said variation voltage signal by an amount related to the amplification of said amplifier; and
   means for applying the attenuated variation voltage signal to the cathode electrode of said RF amplifier so that the output signal appearing at the anode electrode due to the amplified attenuated variation voltage signal is equal in amplitude and opposite in phase to the variations in the DC supply voltage, whereby the variations in the DC supply voltage are substantially neutralized.

2. Means for neutralizing the effect of supply voltage variations in the output signal of a vacuum tube amplifier stage having anode, cathode and grid electrodes comprising:
   means for detecting supply voltage variations and for providing a correction signal related thereto, said variations having a varying relationship to the supply signal; and
   means for applying said correction signal to the cathode of said amplifier to thereby substantially neutralize supply voltage variations by the amplification by the amplifier stage of said correction signal.

3. The neutralizing means of claim 2 wherein said detecting means comprises a voltage divider network.

4. The neutralizing means of claim 2 wherein said applying means comprises two transistors electrically connected to each other in emitter-follower configuration.

5. The neutralizing means of claim 4 wherein said detecting means comprises a DC blocking capacitor serially connected with a voltage divider.

6. A circuit for suppressing undesirable A.C. signals superimposed on a power supply voltage comprising:
   a grounded grid triode RF amplifier having anode, cathode and grid electrodes, said amplifier deriving its energization at its anode from said power supply voltage;
   means for detecting undesirable A.C. signals in the power supply voltage; and
   means for applying a predetermined portion of the detected A.C. signals to the cathode electrode of the amplifier so that the portion of the A.C. signals when amplified by the amplifier substantially neutralizes the undesirable A.C. signals at the anode.

7. A circuit for neutralizing undesirable A.C. signals in a power supply voltage signal comprising:
   a high voltage filter capacitor connected between a power supply voltage and a ground reference voltage to reduce power supply voltage variations;
   a grounded grid triode RF amplifier with the anode electrode thereof connected to said high voltage filter and with the cathode electrode thereof connected to the source of an RF signal to be amplified;
   a plurality of resistors connected in series between said filter and said ground reference for deriving a correction signal related to said power supply voltage; and
   means including two transistors connected in emitter-follower configuration for applying a selected portion of said correction signal to the cathode electrode of said amplifier;
   whereby the effect of variations in said supply voltage signal which pass beyond said high voltage filter capacitor are neutralized.

8. A circuit for eliminating A.C. signals from a voltage signal having both A.C. and D.C. signal components comprising:
   a grounded grid triode amplifier;
   means for applying said voltage signal to the anode electrode of said amplifier;
   means for deriving a correction signal related to the A.C. signal in said voltage signal; and
   means including a D.C. blocking capacitor and a voltage divider for applying a selected portion of said corrective signals to the cathode electrode of said amplifier, said selected portion being of sufficient magnitude so that upon amplification by said amplifier, the amplified correction signals substantially eliminate the A.C. signal appearing at the anode electrode.

* * * * *